United States Patent [19]

Hunt

[11] 3,973,198

[45] Aug. 3, 1976

[54] IN-CIRCUIT SEMICONDUCTOR TESTER

[76] Inventor: Bill Hunt, 4317 Rucker, Everett, Wash. 98203

[22] Filed: Oct. 29, 1974

[21] Appl. No.: 518,244

[52] U.S. Cl. .......................... 324/158 D; 324/158 T
[51] Int. Cl.² ....................................... G01R 31/22
[58] Field of Search ........ 324/158 D, 158 T, 158 R, 324/73 R

[56] References Cited
OTHER PUBLICATIONS

Grant, H. C.; "Zener Diode . . ."; Semiconductor Products; Jan. 1962; pp. 34–37.

*Primary Examiner*—R. V. Rolinec
*Assistant Examiner*—Ernest F. Karlsen
*Attorney, Agent, or Firm*—Cole & Jensen

[57] ABSTRACT

An apparatus for testing the junctions of a semiconductor while the semiconductor is in an electrical circuit. The apparatus includes a step-down transformer which operates preferably from a 120 volt AC source. A low voltage secondary winding preferably includes a common lead, a 6.5 volt lead, and a secondary tap lead between the common lead and the 6.5 volt lead. The 6.5 volt lead is connected through a low value resistance to ground. The test leads of the apparatus are connected to the secondary winding of the transformer in such a manner that a low circuit output impedance is maintained at the test leads. Connections to the horizontal and vertical inputs of a conventional oscilloscope or similar apparatus are provided through a voltage divider to the common lead and the tap lead, respectively. In operation, the pattern generated on the face of the oscilloscope in indicative of the condition of the junction of the semiconductor.

14 Claims, 9 Drawing Figures

IN-CIRCUIT SEMICONDUCTOR TESTER

BACKGROUND OF THE INVENTION

This invention relates generally to the art of electronic test apparatus, and more particularly, concerns the testing of the various junctions of semiconductor elements.

With the significant increase in the use of semiconductor devices in electronic circuits has arisen a need for test apparatus whichh can accurately determine the operating condition of the semiconductor. A wide range of circuit elements can be included under the generic term "semiconductors", including diodes, transistors and controlled gate devices. Furthermore, many complicated semiconductors have been devised in recent years using multiple junctions and specialized gating arrangements.

There are currently available many devices which in one manner or another attempt to test the operation of semiconductors and provide a reliable indication thereof. As an example, special curve tracer attachments to oscilloscopes are well-known for the testing of certain transistors. Other test apparatus, some very complicated and expensive for testing of complex semiconductor devices, and others rather simple for testing of single junction semiconductors, are also available. However, a common fault of present semiconductor test apparatus is that they are unable to test the operation of a semiconductor while the semiconductor is physically connected in a low impedance circuit, which is often the case. Thus, the testing of semiconductors in such low impedance circuits requires the physical disconnection or removal of the semiconductor from the circuit. Although not critical in some instances, the necessity of physical disconnection of individual semiconductors from their operational circuits, before testing thereof, results in significant additional time and expense in repair of electronic circuits, and may well prevent full and complete investigation of possible semiconductor damage or failure in complex circuits.

In view of the above, it is a general object of the present invention to provide a semiconductor test apparatus which overcomes the disadvantages of the prior art discussed above.

It is another object of the present invention to provide such a test apparatus which is capable of testing semiconductors while they are physically connected in an electronic circuit.

It is a further object of the present invention to provide such a test apparatus which provides a visual indication of the operating condition of a semiconductor.

It is yet another object of the present invention to provide such a test apparatus which may be conveniently operated from 120 volt AC power.

It is a still further object of the present invention to provide such a test apparatus which is capable of accurately testing semiconductors which are physically connected in a low impedance circuit.

It is another object of the present invention to provide such a test apparatus which is capable of testing individual junctions in a semiconductor.

It is a further object of the present invention to provide such a test apparatus which provides signals for connection to the horizontal and vertical inputs of a standard oscilloscope, the pattern on the oscilloscope derived from such signals providing an indication of the operating condition of that semiconductor junction connected between the test leads of the apparatus.

It is yet another object of the present invention to provide such a test apparatus having a relatively low output impedance presented to its test leads.

SUMMARY OF THE INVENTION

Briefly, the present invention is operative to provide signals to the respective inputs of an oscilloscope or other two coordinate indicator means to produce visual patterns which are indicative of the operating state of a semiconductor junction which is connected to the tester. The tester includes transformer means having a primary winding and at least one secondary winding with the secondary winding having one of its leads designated as a common lead and further having second and first voltage tap points located sequentially along the winding from the common lead. In one embodiment, the common lead and the first voltage tap point form the bottom and top leads, respectively, of the secondary winding, while the second voltage tap point is positioned at a point along the secondary winding therebetween. A first impedance means is connected between said first voltage tap point and circuit ground, and test lead means are provided which are adapted to connect the semiconductor junction between the common lead and ground. Means are also provided for referencing said second voltage tap point to ground. The signal present at the second voltage tap point is thus developed in operation across the referencing means for application by a connecting means to one input of the oscilloscope or other two coordinate indicator means. Finally, means are provided for applying at least a portion of the signal developed in operation across the semiconductor junction under test to the other input of the oscilloscope or other two coordinate indicator means.

More specifically, the first impedance means, in one embodiment of the invention, has a value which is less than the effective impedance of the circuit in which the semiconductor under test is connected.

DESCRIPTION OF THE DRAWINGS

A more thorough understanding of the invention may be obtained by a study of the following detailed description taken in connection with the accompanying drawings in which:

FIG. 2b shows a pattern generated when a very low value of resistance is provided between the test leads.

FIG. 2c shows such a pattern generated when sufficient resistance exists between the test leads to reduce the voltage at the vertical input to the scope to zero, which in the preferred embodiment is approximately 30 ohms.

FIG. 2d is such a pattern generated when a greater resistance than that of FIG. 2c is connected between the test leads.

FIG. 2e shows such a pattern generated when the semiconductor junction is operating properly.

FIG. 2f is an oscilloscope pattern generated when the semiconductor junction connected between the test leads is beginning to open.

FIG. 2g is such an oscilloscope pattern generated when the semiconductor junction is in a leaky condition.

FIG. 2h is an oscilloscope pattern generated when two series-connected semiconductor junctions are both functioning properly.

DESCRIPTION OF THE PREFERRED EMBODIMENT

Figure 1:
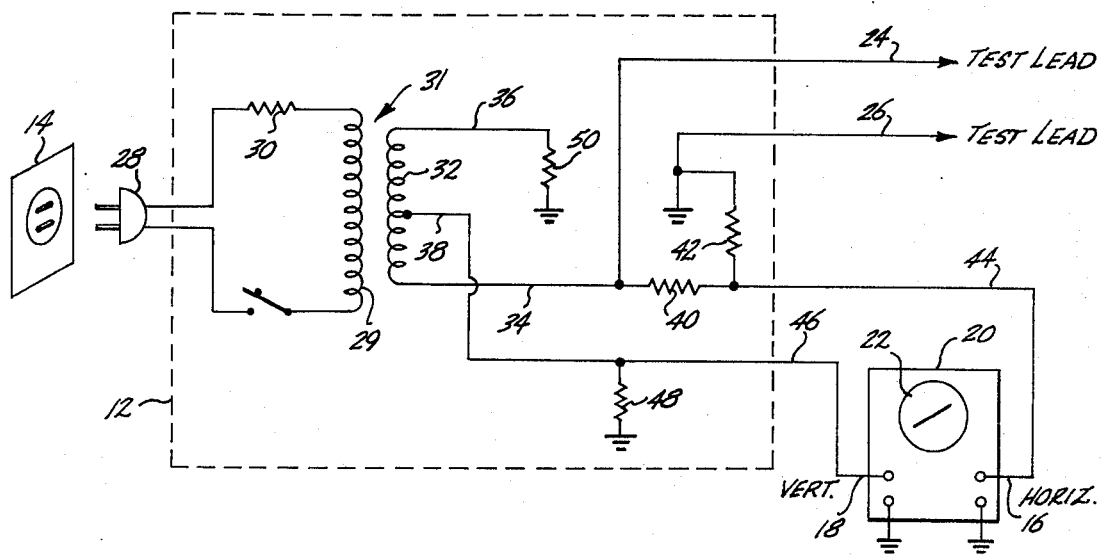
FIG. 1 is a schematic diagram of the circuit used in the test apparatus of the present invention.
Figure 1:
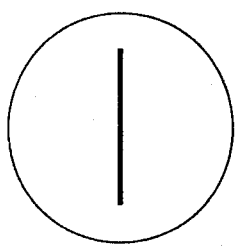

Referring now to FIG. 1, the test apparatus 12 is shown connected in operation between a source of 120 volts AC, typically a wall socket 14 which supplies the AC power for the apparatus, and to the horizontal and vertical inputs 16 and 18, respectively, of a conventional cathode ray oscilloscope 20. When the oscilloscope 20 is connected to the test apparatus 12 in such a manner, the standard internal saw tooth signal generating circuit providing the horizontal sweep for the scope is disconnected, and the test apparatus 12 supplies both the vertical and the horizontal voltages for generation of a pattern on the face 22 of the oscilloscope 20.

The circuit of the test apparatus is arranged such that distinct oscilloscope patterns are generated corresponding to the condition of the semiconductor junction connected between the test leads 24 and 26, which flexibly extend from the test apparatus in a conventional fashion for ease of connection of the test apparatus to a particular semiconductor connection in a circuit. Alligator clips or similar devices (not shown) are secured to the free ends of test leads 24 and 26 for convenient attachment to the leads of the semiconductor junction to be tested.

The present invention is designed to test semiconductors on a junction by junction basis. Test leads 24 and 26 are physically attached by the operator to the leads of a semiconductor element. The semiconductor junction or junctions which lie between the two leads is then tested. A semiconductor junction, within the meaning of this application, refers to the interface between two dissimilar semiconductor materials, such as the physical interface between P-type materials and N-type materials in the classical junction transistor. Examples of semiconductors which may be accurately tested by this apparatus include diodes, transistors, and controlled gate semiconductors such as SCR's, which may be tested by shorting its gate to its cathode or anode, depending on whether it is positively or negatively fired. Typically, each distinct junction of the semiconductor is tested in turn, although it is also possible to test two junctions in series.

When the test apparatus 12 is connected to a source of 120 volt AC voltage 14 by means of circuit plug 28, apparatus 12 is operative. The plug 28 is in turn connected to the primary winding 29 of step-down transformer 31. In series with the primary winding 29 is a resistance 30 which functions to limit the current in the secondary winding 32 of the transformer and hence the remainder of the test apparatus, the resistance 30 having a preferred value of 3300 ohms. It is necessary to limit the current in the secondary 32 of the transformer 31 so as to protect the semiconductors under test from excessive current and possible burn-out under loaded conditions.

In its simplest form, the test apparatus includes the single secondary winding 32, which preferably develops 6.5 volts between common lead 34 and lead 36, while 4.5 volts AC is developed between common lead 34 and tap lead 38. The common lead 34 at one end of the secondary winding 32 is connected through a voltage divider comprised of substantially equal resistances 40 and 42 to test lead 26, which is at circuit ground. Test lead 24 is coupled directly to the common lead 34 of secondary transformer winding 32, the semiconductor junction connected between test leads 24 and 26 thus being presented between circuit ground and common lead 34. A line connection 44 to the horizontal input 16 of the oscilloscope is taken from the voltage divider between resistances 40 and 42, with the voltage at the scope horizontal input thus being equal to the voltage established across resistance 42 to ground. Resistances 40 and 42 are preferably on the order of 100 K ohms. In the arrangement of the preferred embodiment, the 100 K ohm values are sufficient to provide a minimum voltage to the horizontal inputs (e.g. 2v pp) for operation of the scope. Tap lead 38 is connected directly, by means of a connection 46 to the vertical input 18 of the oscilloscope, with the voltage at the scope vertical input 18 being equal to the voltage established by resistance 48, which is coupled between line connection 46 and circuit ground. Resistance 48 provides a reference to ground for the vertical input 18 of the scope 20, and also functions as a voltage divider to develop and maintain a minimum value voltage for operation of the vertical deflection circuits of the scope 20. Preferably resistance 48 is 4.7 K ohms. Secondary winding lead 36, on which appears 6.5 volts AC referenced to common lead 34, is connected through a low value resistance 50 to ground. Resistance 50 is preferably on the order of 10 ohms, so as to provide a minimum load impedance across test leads 24 and 26.

In operation, the voltages presented at the horizontal and vertical inputs 16 and 18, typically are 60 cycle in-phase or 180° out-of-phase AC voltages, and thus the pattern presented on the scope face 22 will always be a line, the configuration and slope on the line depending upon the operating condition of the semiconductor junction connected between test leads 24 and 26. When there is a short circuit between the test leads 24 and 26 (i.e., the semiconductor junction is shorted), resistance 42 will be effectively shunted by the short circuit, and there will be no horizontal sweep voltage present at the horizontal input 16 to the oscilloscope 20. With no horizontal input, the pattern on the scope face 22 will be that shown in FIG. 2a, a straight vertical line. This conforms to the pattern expected when there is an AC signal present at the vertical input to a scope, but no signal present at the horizontal input.

Figure 2A:
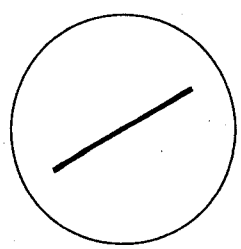
FIG. 2a shows an oscilloscope pattern generated by the circuit of FIG. 1 when there is a short circuit between the test leads.
Figure 2A:
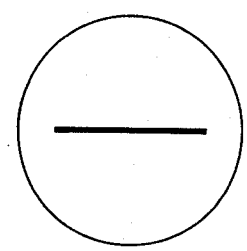
Figure 2A:
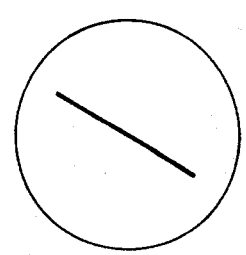
Figure 2A:
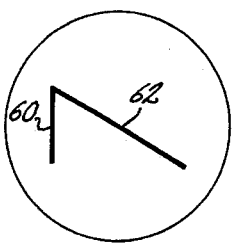
Figure 2A:
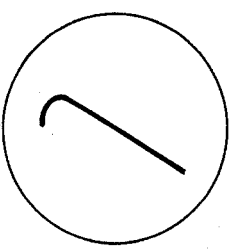
Figure 2A:
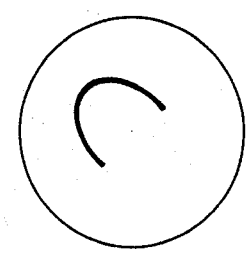
Figure 2A:
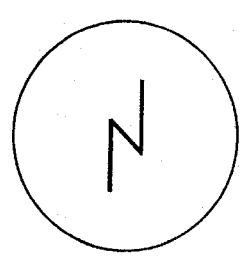

If instead of a short, however, there is a circuit connected between the test leads 24 and 26 which includes some component of resistance, the straight vertical line of FIG. 2a will begin to swing away from the vertical in a clockwise rotation about the center of the line as the resistance increases. The direction of swing is clockwise if the plates of the oscilloscope 20 are connected as described above. If connected opposite to that configuration, the direction of swing will be, of course, counterclockwise. This is again in conformance with conventional theory, since as some resistance is presented between the test leads, a portion of the AC signal developed between the common lead 34 and lead 36 will be dropped across resistance 42, providing an AC signal to the horizontal input 16 of the oscilloscope. Since the AC voltages present on line connectors 44 and 46 have the same frequency and are in phase, there will be a diagonal line presented across the scope face 22, the amount of the angle of the line trace from the horizontal being dependent upon the amplitude of respective voltages at horizontal and vertical inputs 16 and 18, respectively. Thus, as the net resistance of the circuit connected between the test leads 24, 26 increases from zero, the voltage at the horizontal input 16 will increase commensurately, forcing the diagonal line to swing increasingly clockwise toward the horizontal. FIG. 2b shows the pattern developed from the circuit of FIG. 1 when there is 10 ohms of resistance connected between test leads 24 and 26.

As the resistance between the test leads continues to increase, indicating a greater net circuit resistance, the voltage present at the scope horizontal input 16 from line connection 44 increases correspondingly, while the voltage present at the scope vertical input 18 from line connection 46 decreases correspondingly. This continues until a resistance of approximately 30 ohms in the preferred embodiment is presented across the test leads, at which point there is zero voltage at the vertical input 18 of the scope, and the line on the scope face 22 is horizontal. This conforms to the pattern expected when there is zero voltage at the vertical input 18 to the scope. This value of resistance, sufficient to cause such a condition, is dependent upon the other circuit elements and their arrangement, as well as the voltage amplitudes present at the various leads from secondary winding 32.

Any further increase in resistance between test leads 24 and 26 will result in a phase reversal of the composite signal flowing through resistance 48, causing the signals appearing at the horizontal and vertical inputs, 16 and 18, respectively, of the oscilloscope 20 to be 180° out of phase. The pattern on the scope is still a line trace, but its direction of slope will change; e.g., as the resistance increases, the line will continue to rotate clockwise about its center such that it now slopes downward from left to right. As the resistance continues to increase (e.g., the resistance of the circuit between the test leads is fairly large) the voltage present at the vertical input 18 to the scope 20 increases, as does the voltage at the horizontal input 16, and the diagonal line trace will thus continue to rotate clockwise, increasing its angle from the horizontal. The line will continue to rotate clockwise as the resistance increases until presumably at an infinite value of resistance, corresponding to an open circuit, the line will assume a final angle, depending upon the value of the remaining resistances in the circuit. Thus, as the angle of the line approaches its final angle, the circuit across the test leads is approaching the condition of an open circuit. FIG. 2d shows the scope pattern for a resistance of 1 K ohms between the two test leads.

When a semiconductor junction is presented across the test leads and the junction is properly operating, a pattern similar to that shown in FIG. 2e occurs. This pattern is due to the basic property of a semiconductor junction, which provides a theoretical short circuit for one direction of current flow while providing a theoretical infinite value of resistance to the current flow in the other direction. Thus, in response to an alternating applied voltage, the junction appears as a short circuit over one-half of the voltage cycle, while appearing as an infinite value of resistance over the other half cycle. Thus, when an AC voltage is applied through the connected semiconductor junction in circuit, the test apparatus and hence the oscilloscope will see a short circuit over one half-cycle of the applied voltage, and will see the effective circuit resistance over the other half-cycle of the applied voltage, since the resistance of the junction over that half-cycle is infinite. For a semiconductor junction in good condition, there should appear on the face of the scope two distinct patterns, one pattern being a straight vertical line 60, indicating a short between the test leads, while the other pattern will be a diagonal line 62 similar to that shown in FIGS. 2b, 2c, or 2d. The direction and slope angle of the line trace is, as discussed above, dependent upon the effective value of resistance in the circuit in which the semiconductor under test is connected.

The diagonal line 62 and the vertical line 60 typically will be connected at one end thereof, resulting in the pattern shown in FIG. 2e when the effective resistance of the circuit is above 30 ohms. If the effective resistance of the circuit is substantially below that of 30 ohms in the test circuit of the preferred embodiment, the diagonal line will, of course, slope in the opposite direction. The vertical line then extends upward from the bottommost end of the diagonal line. Thus, a semiconductor junction which is operating properly will present a combination of a straight vertical line joined with a diagonal line having a definitive slope and direction, depending upon the resultant effective resistance of the circuit in which the tested semiconductor is connected. Along this line, if two junctions are connected in series, and both are good, two vertical lines are produced, as shown in FIG. 2h, connected by a very short diagonal line section.

If the operating condition of the semiconductor junction is less than optimum, but still functioning (i.e., the junction under test is not either shorted or open), the deteriorating operating condition will be similar to the pattern shown in FIG. 2f for a semiconductor junction which is opening, and the pattern shown in FIG. 2g for a semiconductor junction which is leaking. Since the signal passed by a semiconductor junction during its "shorted" half-cycle will be cut off by a semiconductor which is opening the somewhat distorted pattern shown in FIG. 2f results. There is no straight vertical line joining sharply with a straight diagonal line, as is the case for a semiconductor junction in good condition. When the semiconductor is leaking, both cycles of operation will be affected, resulting in the half-circle pattern of FIG. 2g, indicating that the semiconductor junction is no longer either very close to a short circuit during one half-cycle nor to infinite resistance during the other half-cycle.

Thus, by observing the pattern on the oscilloscope 20 generated as a result of a particular semiconductor junction being connected in circuit between the test leads, an accurate indication can be obtained of the operating condition of the semiconductor junction itself. The patterns not only indicate whether the junction is completely shorted or completely open, but also indicate when the junction is marginally effective, either beginning to open during its conductive half-cycle, or leaking.

Thus, a test apparatus has been developed which provides AC signals which are in turn connected to the horizontal and vertical inputs of an oscilloscope. The AC signals so provided have the same frequency, and are either in phase or 180° out-of-phase. The condition of the semiconductor junction and in associated circuit so affects the phase and magnitude of the AC voltages presented to the scope that the operating condition of the semiconductor junction can be accurately determined by inspecting the pattern generated on the oscilloscope. By connecting the circuit elements in the manner described above and shown in FIG. 1, an extremely low output impedance is provided, thereby permitting accurate testing of semiconductor junctions while they are in a low-impedance circuit. The value of the resistances and other circuit elements present in the above-described preferred embodiment have been chosen for specific current limiting purposes and also to provide proper operating voltages for general-purpose oscilloscopes. It should be recognized, however, that the value of the resistances and the voltages developed across the secondary winding of the step-down transformer may be altered, depending upon particular applications. Thus, the precise values of resistances and voltages pointed out above should not be considered critical per se to the operation of the test apparatus, as other combinations of voltages and resistances may be utilized in particular circumstances, so long as there is sufficient voltage operating the internal circuits of the oscilloscope, and as long as there is presented a sufficiently low output impedance to permit testing of semiconductors in place.

What is claimed is:

1. An in-circuit semiconductor junction tester, useful in combination with an oscilloscope having two input connections referenced to ground, for indicating the operating state of a semiconductor junction while the semiconductor remains connected in circuit, the semiconductor junction tester comprising:
   a. transformer means having a primary winding and at least one secondary winding, said secondary winding having a common lead and first and second voltage tap leads, said transformer means, when energized by a voltage applied to said primary winding, providing a first AC voltage between said common lead and said first voltage tap lead and a second AC voltage between said common lead and said second voltage tap lead, said first AC voltage being greater in amplitude than said second A.C. voltage;
   b. first impedance means connected between said first tap lead and ground;
   c. second impedance means connected between said second tap lead and ground;
   d. means adapted to connect said second tap lead to one input connection of the oscilloscope, such that at least a portion of said second AC voltage is applied to said one input connection;
   e. third impedance means connected between said common lead and ground;
   f. means adapted to connect said common lead to the other input connection of the oscilloscope, such that, as long as said semiconductor junction being tested has impedance, at least a portion of said first AC voltage is applied to said other input connection; and
   g. means adapted to connect the semiconductor junction to be tested across said third impedance means.

2. An apparatus of claim 1, wherein said first impedance means has a value which is less than the effective value of impedance of the circuit in which the semiconductor being tested is connected.

3. An apparatus of claim 2, wherein said first impedance means has a value of approximately 10 ohms.

4. An apparatus of claim 1, wherein said first AC voltage is approximately 6.5 volts, and wherein said second AC voltage is approximately 4.5 volts.

5. An apparatus of claim 1, wherein said third impedance means is a voltage divider having first and second ends and comprising first and second voltage divider resistances having a common midpoint and being of substantially equal value, wherein said first end of said voltage divider is connected to ground, said second end of said voltage divider is connected to said common lead, and wherein said tester further includes means adapted to connect said common midpoint to the other input connection of said oscilloscope.

6. An apparatus of claim 5, wherein the value of said first and second voltage divider resistances is approximately 100 kohms.

7. An apparatus of claim 1 wherein the voltages applied to said one input connection and said other input connection of the oscilloscope have a phase relationship selected from the group consisting of:
   a. in-phase; and
   b. 180° out-of-phase.

8. An in-circuit semiconductor junction tester for indicating the operating state of a semiconductor junction while the semiconductor remains connected in circuit, the semiconductor junction tester comprising:
   a. indicator means having two input connections referenced to ground;
   b. transformer means having a primary winding and at least one secondary winding, said secondary winding having a common lead and first and second voltage tap leads, said transformer means, when energized by a voltage applied to said primary winding, providing a first AC voltage between said common lead and said first tap lead and a second AC voltage between said common lead and said second tap lead, said first AC voltage being greater in amplitude than said second AC voltage;
   c. first impedance means connected between said first tap lead and ground;
   d. second impedance means connected between said second tap lead and ground;
   e. means adapted to connect said second tap lead to one input connection of said indicator means, such that at least one portion of said second AC voltage is applied to said one input connection;
   f. third impedance means connected between said common lead and ground;
   g. means adapted to connect said common lead to the other input connection of said indicator means, such that as long as said semiconductor junction to be tested has impedance, at least a portion of said first AC voltage is applied to said other input connection; and
   h. means adapted to connect the semiconductor junction to be tested across said third impedance means, said indicator means providing a visual indication of the operating state of said semiconductor junction in response to signals applied at the respective input connections of said indicator means.

9. An apparatus of claim 8 wherein said indicator means is an oscilloscope.

10. An in-circuit semiconductor junction tester, useful in combination with a two coordinate indicator means having two input connections referenced to ground, for indicating the operating state of a semiconductor junction while the semiconductor remains connected in circuit, the semiconductor junction tester comprising:
   a. transformer means having a primary winding and at least one secondary winding, said secondary winding having in succession therealong a common lead, a second voltage tap point, and a first voltage tap point;
   b. first impedance means connected between said first voltage tap point and ground;
   c. second impedance means connected between said second tap point and ground;
   d. means connecting said second voltage tap point to one input of the two coordinate indicator means;
   e. test lead means adapted to connect the semiconductor junction between said common lead and ground; and
   f. third impedance means connected between said common lead and ground for applying at least a portion of the signal developed in operation across said semiconductor junction to the other input of said two coordinate indicator means.

11. An apparatus of claim 10, wherein said first impedance means has a value which is less than the effective value of the impedance of the circuit in which the semiconductor being tested is connected.

12. An apparatus of claim 11, wherein said first impedance means has a value of approximately 10 ohms.

13. An apparatus of claim 10, wherein said third impedance means includes a voltage divider having first and second ends and comprising first and second voltage divider resistances having a common mid-point and being of substantially equal value, wherein said first end of said voltage divider is connected to ground, said second end of said voltage divider is connected to said common lead, and wherein said third impedance means further includes means connecting said common mid-point to the other input of said two coordinate indicator means.

14. An apparatus of claim 12, wherein said secondary winding supplies 6.5 volts between said common lead and said first voltage tap point, and 4.5 volts between said common lead and said second voltage tap point.

* * * * *